(12) United States Patent
Gupta et al.

(10) Patent No.: US 7,054,191 B1
(45) Date of Patent: May 30, 2006

(54) METHOD AND SYSTEM FOR WRITING DATA TO MEMORY CELLS

(75) Inventors: Rajesh Narendra Gupta, San Jose, CA (US); Scott Robins, San Jose, CA (US)

(73) Assignee: T-Ram, Inc., San Jose, CA (US)

( * ) Notice: Subject to any disclaimer, the term of this patent is extended or adjusted under 35 U.S.C. 154(b) by 0 days.

(21) Appl. No.: 10/860,194

(22) Filed: Jun. 3, 2004

(51) Int. Cl.
*G11C 11/39* (2006.01)
*G11C 11/34* (2006.01)

(52) U.S. Cl. .................. 365/180; 365/175; 365/189.01
(58) Field of Classification Search ..................... None
See application file for complete search history.

(56) References Cited

U.S. PATENT DOCUMENTS 5,883,829 A * 3/1999 van der Wagt ............. 365/159
6,229,161 B1 5/2001 Nemati et al.
6,735,113 B1 * 5/2004 Yoon et al. ................. 365/174

* cited by examiner

*Primary Examiner*—Son Mai

(57) ABSTRACT

A first and a second set of memory cells are connected to the same first word line and second word line. At the commencement of data writing, the first word line is set up. The first set of memory cells is read and temporarily stored into a buffer. At about the same time, the bit lines of the second set of memory cells is set up. After completion of reading of the first set of memory cells, the bit lines of this set of memory cells are set up (while the setting up of the bit lines of the second set of memory cells continues). After the bit lines of both sets of memory cells are set up, the second word line is pulsed. At this time, written into both sets of memory cells begins, which comprises data previously read from the first set of memory cells and new data to be written into the second set of memory cells. It is found that this method reduces the overall write time.

24 Claims, 3 Drawing Sheets

METHOD AND SYSTEM FOR WRITING DATA TO MEMORY CELLS

FIELD OF THE INVENTION

The present invention relates to data writing, and specifically to system and method for reducing the time for writing data to semiconductor memory cells.

BACKGROUND

Recent technological advances in the semiconductor industry permitted dramatic increases in integrated circuit density and complexity. These improvements have led to a dramatic increase in their use in a variety of applications, especially digital applications. An important part in the design, construction, and manufacture of semiconductor devices concerns semiconductor memory and other circuitry used to store information. Conventional random access memory devices include a variety of circuits, such as static random access memory (SRAM) and dynamic random access memory (DRAM) circuits. The structure of such memory circuitry typically contains at least one storage element and circuitry designed to access the stored information. DRAM is very common due to its high density (which results in a low price), with DRAM cell size being typically between 6 $F^2$ and 8 $F^2$ (where F is the minimum feature size). However, with typical DRAM access times of approximately 50 nsec, DRAM is relatively slow compared to typical microprocessor speeds. SRAM is another common semiconductor memory that is much faster than DRAM. SRAM cells are typically constructed using 4 transistors and 2 resistors or 6 transistors, which result in much lower density, with typical cell size being between about 60 $F^2$ and 150 $F^2$.

Recently, a new type of memory cells has been developed. These cells consist of a control port that is capacitively coupled to a relatively thin thyristor body. The thyristor body is sufficiently thin to permit modulation of the potential of the thyristor body in response to selected signals capacitively coupled via the control port. Such capacitively-coupled signals are used to enhance switching of the thyristor-based device between current-blocking and current-conducting states. One advantage of this type of cells is that the cell size is much smaller than the SRAM cells. Further, the access time of this type of cells is much faster than DRAM. Details of such thinly capactively coupled thyristor memory cells can be found in U.S. Pat. No. 6,229,161.

In many digital applications, a reduction in memory write time generally leads to improved performance. Consequently, it is desirable to reduce memory write time of such thyristor-based devices.

SUMMARY

One embodiment of the present invention involves a method for modifying data in a first set of memory cells while data in a second set of memory cells are not modified. The access devices of the two sets of memory cells are connected to the same first word line and the storage cells of the two sets of memory cells are connected to the same second word line. All memory cells in the first and second sets are written into even though only one cell is the actual target of a write operation. At the commencement of writing, the first word line is set up. The first set of memory cells is read and temporarily stored into a buffer. At about the same time, the bit lines of the second set of memory cells are set up. After completion of reading of the first set of memory cells, the bit lines of this set of memory cells are set up (while the setting up of the bit lines of the second set of memory cells continues). After the bit lines of both sets of memory cells are set up, the second word line is pulsed. At this time, all the memory cells are written into with data, which comprise data previously read from the first set of memory cells and new data to be written into the second set of memory cells. It is found that this method reduces the overall write time.

The above summary is not intended to describe each illustrated embodiment or every implementation of the present invention. The figures and detailed description that follow more particularly exemplify these embodiments.

BRIEF DESCRIPTION OF THE DRAWINGS

Various embodiments of the present invention and methods of operation may be further understood by reference to the following detailed description when read together with the accompanying drawings, in which.

DETAILED DESCRIPTION

In the following description, numerous specific details are set forth to provide an understanding of exemplary embodiments of the present invention. It will be understood, however, that these embodiments may comprise alternative combinations of the disclosed examples. Additionally, readily established circuits and procedures of the exemplary embodiments may be disclosed in simplified form (e.g., simplified block diagrams, flow charts and/or description) to avoid obscuring an understanding of the embodiment with excess details.

Figure 1:
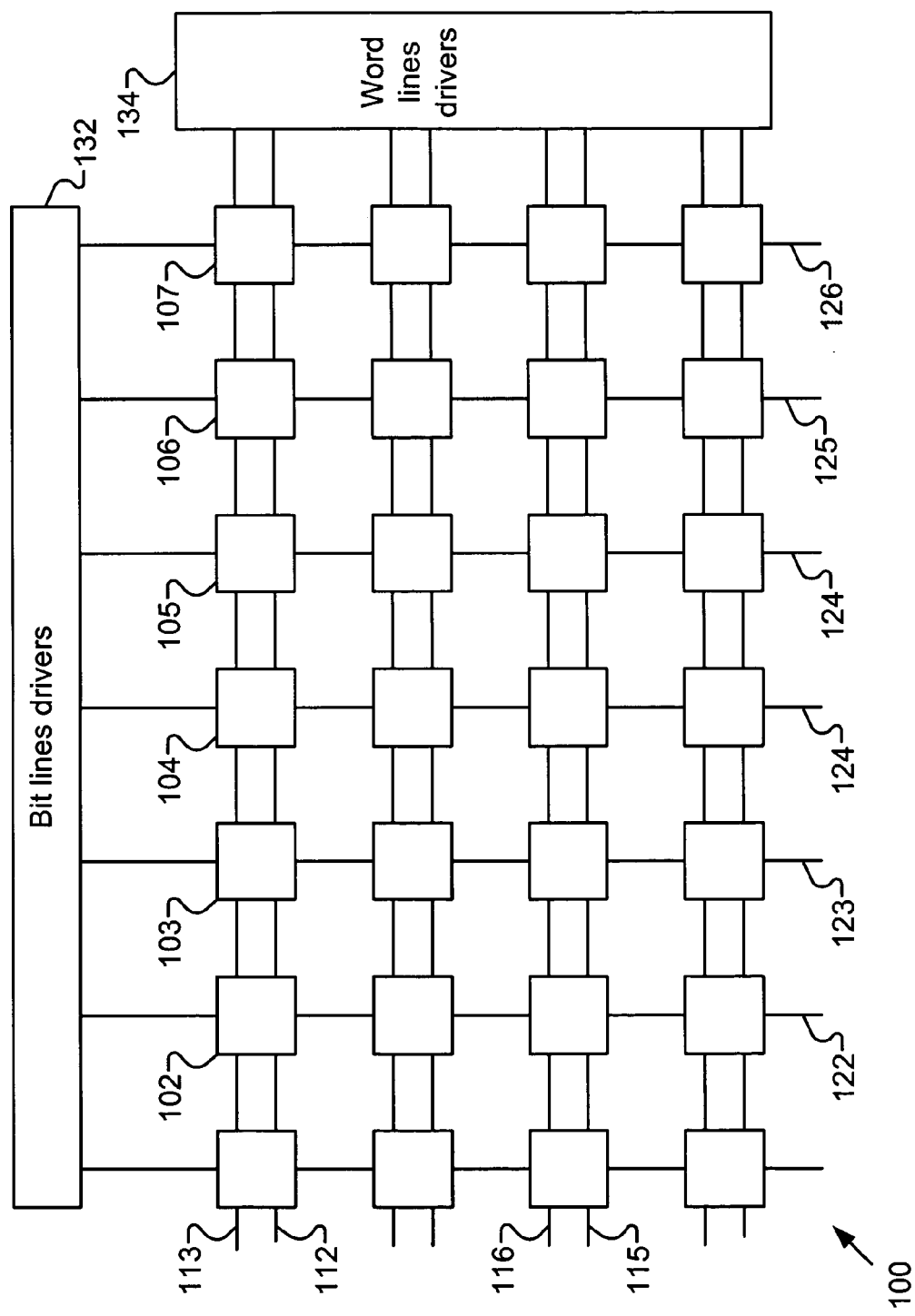
FIG. 1 is a schematic diagram of a portion of a memory device of the present invention.

FIG. 1 is a schematic diagram of a portion of a memory device 100 of the present invention. It contains a plurality of memory cells, such as cells 102–107, preferably arranged in rows and columns. Each cell in a row is connected to two word lines, such as word line one (WL1) 112 and word line two (WL2) 113 for one row and WL1 115 and WL2 116 for another row. Each cell in a column is connected to a bit line, such as bit lines 122–126. A set of drivers, shown collectively as bit lines drivers 132, are used to set up appropriate voltage levels of individual bit line when it is being accessed. Another set of drivers, shown collectively as word lines drivers 134, are used to set up appropriate voltage levels of individual word line when it is accessed.

Figure 2B:
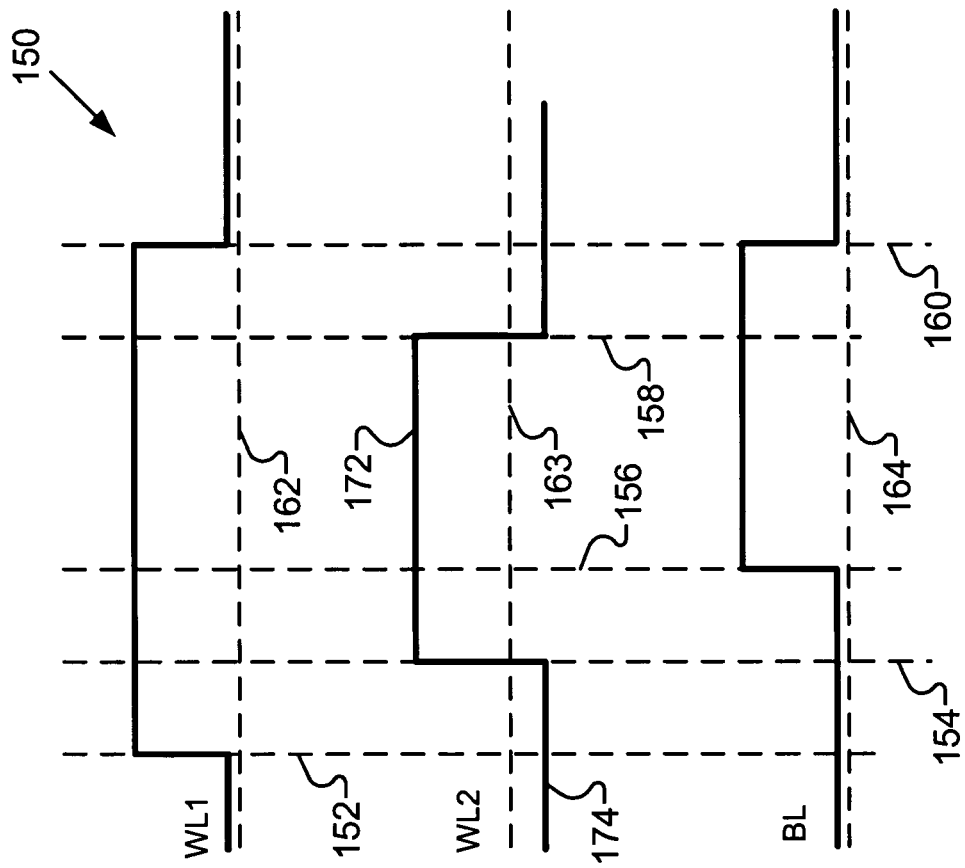
FIG. 2B shows timing diagrams of one embodiment of write zero operation in accordance with the present invention.
Figure 2A:
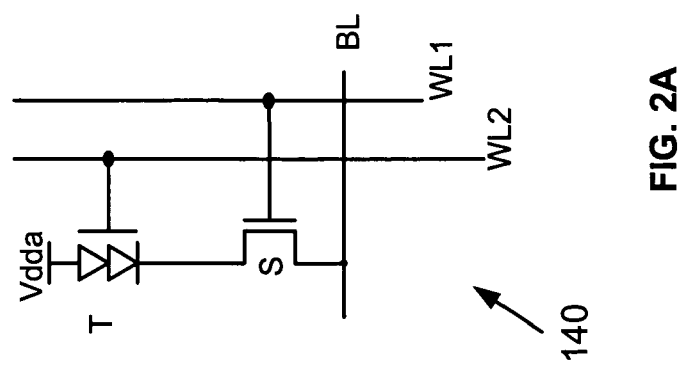
FIG. 2A is a schematic diagram of a thinly capacitively coupled thyristor memory cell that can be used in the memory device of FIG. 1.

In an exemplary memory device 100, the memory cells 102–107 are thinly capacitively coupled thyristor memory cells (referred herein as thyristor RAM cells). A schematic drawing of a thyristor RAM cell 140 is shown in FIG. 2A. It comprises a storage cell T (implemented using a thinly capacitively coupled thyristor) and an access device S. The anode of storage cell T is connected to a high voltage level Vdda and the cathode is connected to access device S. When memory cell 140 is in an "on" state, it generates a current to represent a logic "1" that is received by a bit line (shown as BL). When it is in an "off" state, it produces essentially no current on the bit line and represents a logic "0." The thyristor RAM cell is adapted to operate with two unique word lines—a first word line (i.e., WL1) and a second word line (i.e., WL2). WL1 is coupled to the gate of access device S, where access device S provides access to storage cell T for transferring bit information between storage cell T and the bit line during both read and write operations. WL2 is coupled to storage cell T and is typically activated only for writing data to the thyristor RAM cell.

In one embodiment of a write operation, both WL1 and WL2 are raised to a positive level to transfer a data signal from the bit line to storage cell T for data storage. However, the voltage level of the bit line is different, depending on whether a "0" or a "1" is being written. To write a logical "0" into storage cell T, a bit line voltage is raised to a level that is about the same as the WL2 level. Conversely, to write a logical "1," into storage cell T, a voltage having a relatively low potential (i.e., ground) is applied to the bit line. One example of write operations is described in the above mentioned U.S. Pat. No. 6,229,161.

Write operations in thyristor RAM cells have special characteristics. For example, writing a "zero" into a memory cell (called herein a "write zero" operation) is slower than writing a "one" into the same cell (called herein a "write one" operation). Thus, it is desirable to reduce the write zero time. FIG. 2B is used to illustrate an exemplary write zero operation in one embodiment of the present invention. It contains a set 150 of timing diagrams of the bit and word lines. In FIG. 2B, dashed lines 162–164 are used to indicate ground voltage level. The voltage of WL1 starts at or near the ground level, and then raised to a positive level at time 152 (e.g., 1.025 volt when the voltage applied to the anode of the thryistor is about 2.0 volts). This turns on access device S so that storage cell T can be written into. At a subsequent time 154, the voltage of WL2 is raised to about the same level as that of WL1. At a further time 156, the voltage of BL is raised to about the same level as that of WL1. Between time 156 and another time 158, a zero is written into storage cell T. Finally, the voltages return to their original levels at time 160. Note that the original level of WL2 may be negative while the original levels of WL1 and BL are preferably at or close to ground.

It is found that the write zero time can be reduced if the interval between times 154 and 156 (i.e., WL2 and BL rise times) is close or equal to zero. In a preferred embodiment, BL rises after WL2. This time interval can be easily adjusted by designing appropriate bit line and word line drivers. This embodiment can improve the overall write time by reducing the write zero time.

It is also found that the write zero time can be reduced by increasing the voltage swing of WL2 (i.e., the difference between the pulsed voltage level 172 when WL2 is high and the steady-state (or "standby") voltage level 174 when WL2 is low). This can be achieved by lowering level 174 (e.g., to −1.8 V) and/or increasing level 172 (e.g., to Vdda). In a preferred embodiment, level 172 is raised to a voltage high than that of WL1 (such as Vdda). If level 172 is sufficiently high, it is possible to move the negative level 174 closer to ground and maintain improved write zero time. Moving level 174 closer to ground can reduce voltage stress on WL2 oxide. The voltage swing can be easily increased by designing appropriate WL2 drivers.

Figure 2C:
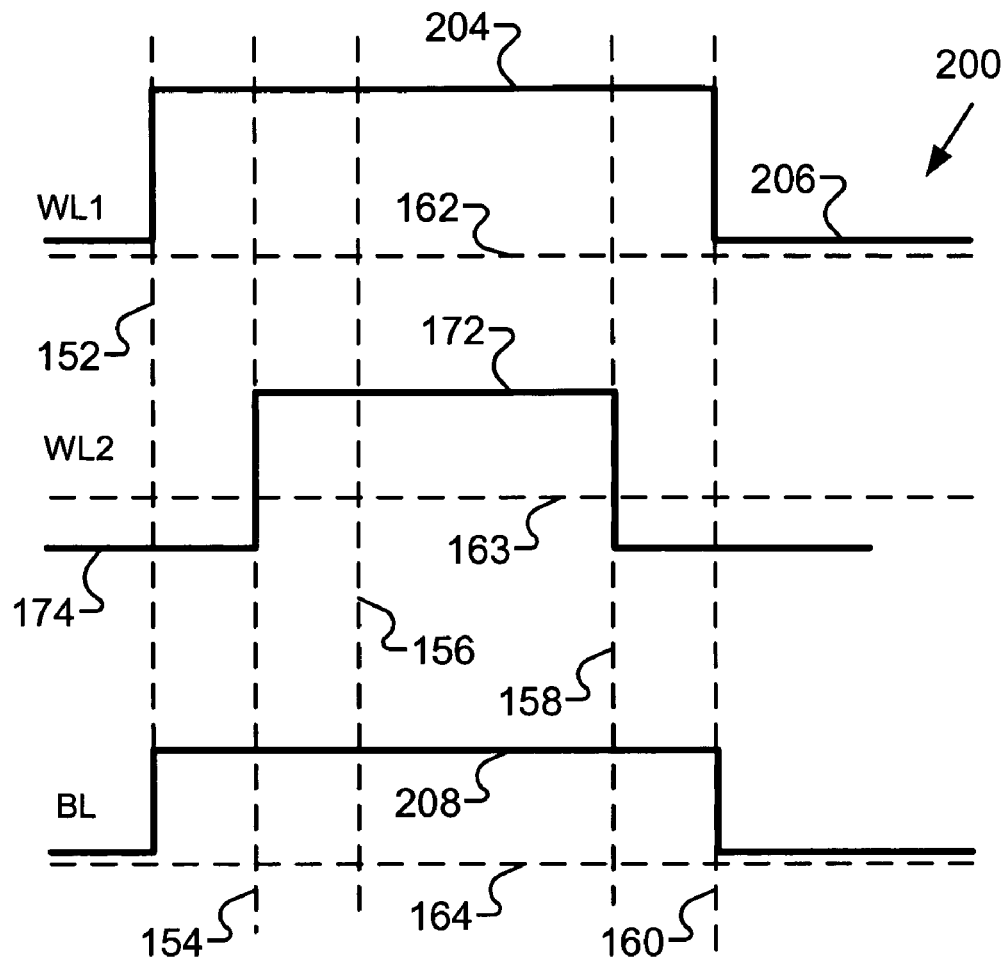
FIG. 2C shows timing diagrams of another embodiment of write zero operation in accordance with the present invention.

The write zero time can also be reduced by the following method: (a) setting the voltage of the WL1 line to a level above that of the bit line by approximately the threshold voltage of access device S of FIG. 2A and (b) raising the voltage of the bit line ahead of raising the voltage of the WL2 line. As explained below, this method provides a very effective method to reduce the overall write time of an array of memory cells, such as those shown in FIG. 1. FIG. 2C shows a set 200 of timing diagrams that is used to illustrate this inventive method. Same reference numerals in FIGS. 2B and 2C refer to the similar timing and voltage levels. Compared to the method shown in FIG. 2B, the voltage level 204 of WL1 is higher in timing diagram 200 than that in timing diagram 150 (such as 1.6 volt in diagram 200 versus 1.025 volt in diagram 150 for the same anode voltage of 2.0 volts). In addition, the rising edge of BL is now before the rising edge of WL2, as opposed to time 156, i.e., after WL2 rising edge, in FIG. 2B.

Returning to FIG. 1 in connection with applying the method of FIG. 2C to reduce overall write time, WL1 112 and WL2 113 are connected to many memory cells. Note that the number of memory cells connected to the word lines is generally determined by many engineering considerations unrelated to the present invention, such as the size of dice, the strength of drivers, timing requirements, etc. In the memory device of FIG. 1, all memory cells sharing the same word lines have to be written at the same time even though only one cell is the actual target of a write operation. In many data processing systems, data in a predetermined number of contiguous memory cells (called the "width") are accessed (read from or written into) at a time (e.g., 16 cells in a 16-bit system and 32 cells in a 32-bit system). In one embodiment, the same WL1 and WL2 that are connected to the target 16 cells (in a 16-bit system) are also connected to a large number of memory cells (e.g., a total of 128 cells). In this case, writing involves the following steps: (a) the data in the 128 cells are first read into a temporary buffer, (b) the bits in the buffer associated with the cells that may be written into are modified while the rest of the bits remain unchanged, and (c) the 128 bits in the buffer are then written back to the 128 cells at the same time. One problem with this method is that the time available for a write operation is reduced by the time for the read before the write (i.e., step a). In another embodiment, the number of memory cells connected to WL1 and WL2 is equal to the width of the system (e.g., only 16 memory cells are connected to WL1 and WL2 in a 16-bit system). In this case, there is no need to perform a read before write. However, this embodiment may lead to inefficient memory array designs.

As mentioned above, write zero operations are slower than write one operations. To complicate matters further, there are additional complexities in the write "0" timing: rewriting a "0" (i.e., writing a "0" when the cell stored a "0" prior to the writing) is faster than overwriting a "0" (i.e., writing a "0" when the cell stored a "1" prior to the writing). One aspect of the present invention is an arrangement that can apply the method shown in FIG. 2C to reduce the overall write time even under these complexities.

Figure 3:
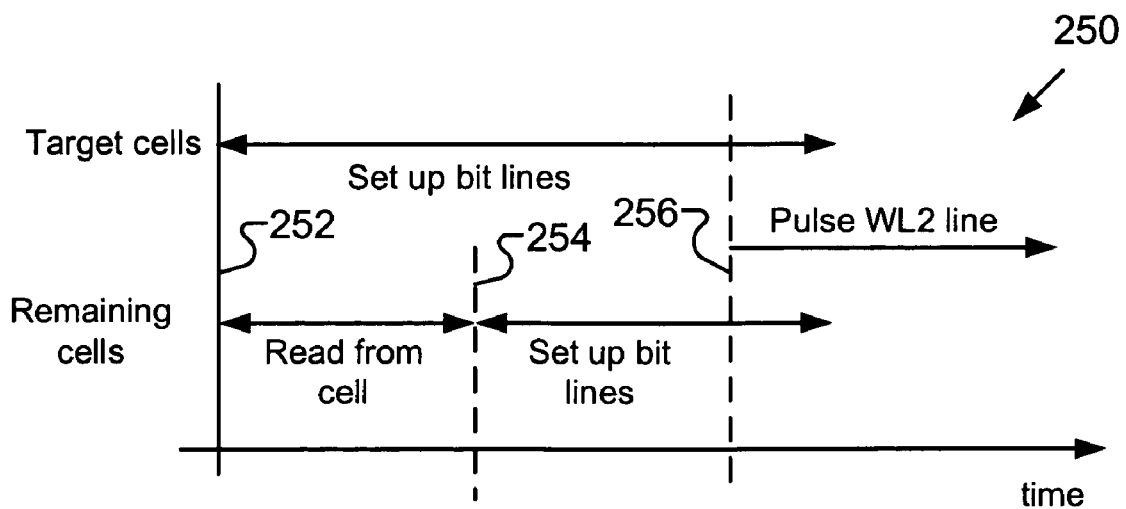
FIG. 3 is a timing diagram of one embodiment of write zero operation of memory cells connected to a world line in accordance with the present invention.

In this embodiment, the number of memory cells connected to WL1 and WL2 lines is larger than the width of the system (e.g., data width of 16 bits and the number of cells is 128). For simplicity, the 16 memory cells are called the "target" cells and the rest of the cells are called "remaining" cells. FIG. 3 is a timing diagram 250 showing the operations of the target and remaining cells. At the start 252 of the operation, the bit lines of the 16 target cells are set up for writing while the remaining cells are read. The bit lines of the target cells are set up as follows:

(a) if a "zero" needs to be written into a cell, the bit line is set at a high voltage (such as 1.2 volt when the voltage at the anode of the storage cell is 2.0 volts);

(b) if a "one" needs to be written into a cell, the bit line is set at a low voltage (such as ground).

At time 254, the read operation of the remaining cells is completed. The bit lines of the remaining bits are now being set up (by raising them to a voltage of, e.g., 1.2 volt). At time 256, the WL2 lines are pulsed to complete the write operation for all the cells. It should be noted that time 256 can take place at any time after the bit lines are set up. The voltage level of the WL2 lines (172 in FIG. 2C) is about the same as the voltage level of the bit lines (208 in FIG. 2C). This will give more time for the target cells to set up the bit lines, which helps to reduce the time for overwriting a zero. As explained above, the slowest time is overwriting zero. Thus, this method reduces the overall write time.

In timing diagram 250 of FIG. 3, the WL1 should be set up at or before the starting time (252). The voltage level of WL1 (e.g., 1.6 volt for voltage level 204 in FIG. 2C) is approximately equal to the sum of the voltage level of the bit lines (e.g., 1.2 volt for voltage level 208 in FIG. 2C) and the threshold voltage of the access device (e.g., 0.4 volt).

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such modifications and changes do not depart from the true spirit and scope of the present invention that is set forth in the following claims.

What is claimed is:

1. A method for writing data into a first set of memory cells, each member of the first set and a second set of memory cells having an access device connected to a first word line and a storage cell connected to a second word line, the method comprising:
   (a) setting up the first word line at a first time;
   (b) setting up bit lines of the first set of memory cells at a second time, the first and the second times being substantially the same;
   (c) reading from the second set of memory cells from a third time to a fourth time, the first and the third times being substantially the same;
   (d) setting up bit lines of the second set of memory cells at a fifth time, the fifth time being subsequent to the fourth time; and
   (e) pulsing the second word line at a time subsequent to the fifth time.

2. The method of claim 1 wherein the setting up of the bit lines of the first set of memory cells comprises setting at least one of the bit lines to approximately a ground level.

3. The method of claim 1 wherein the setting up of the bit lines of the first set of memory cells comprises setting at least one of the bit lines to a positive level.

4. The method of claim 3 wherein the pulsing the second word line comprises pulsing the second word line to a voltage level that is approximately the same as or higher than the positive level.

5. The method of claim 3 wherein setting up the first word line comprises setting the first word line to a first level, and wherein the first level is higher than the positive level on any one of the bitlines.

6. The method of claim 5 wherein the access device has a threshold level, and wherein the first level is higher than the positive level by approximately the threshold level.

7. The method of claim 1 wherein the memory cells are thinly capacitively coupled thyristor memory cells.

8. A method for writing a zero into a memory cell having an access device connected to a first word line and a bit line and having a storage cell connected to a second word line, the method comprising:
   (a) setting the first word line to a first predetermined positive voltage level at a first time;
   (b) setting the bit line to substantially the first predetermined voltage level and at a second time, the second time being subsequent to the first time; and
   (c) pulsing the second word line to a second predetermined voltage level and at a third time, the third time being substantially the same as the second time.

9. The method of claim 8 wherein the memory cell is a thinly capacitively coupled thyristor memory cell.

10. The method of claim 9 wherein the thinly capacitively coupled thyristor memory cell comprises an anode, and wherein the second predetermined voltage level is substantially the same as a voltage at the anode.

11. The method of claim 9 wherein the pulsing comprises pulsing the second word line to a voltage level that is higher than the first voltage level.

12. The method of claim 8 wherein the memory cell is one of an array of memory cells.

13. The method of claim 8 wherein the second predetermined voltage level is higher than the first predetermined voltage level.

14. The method of claim 8 wherein the second word line has a negative steady-state voltage.

15. A method for writing a zero into a memory cell having an access device connected to a first word line and a bit line and having a storage cell connected to a second word line, the method comprising:
   (a) setting the first word line to a first positive voltage level at a first time;
   (b) setting the bit line to a second positive voltage level and at a second time that is substantially the same as the first time, the second voltage level being lower than the first voltage level; and
   (c) pulsing the second word line at a third time, the third time being subsequent to the first time.

16. The method of claim 15 wherein the access device has a threshold voltage, and wherein the difference between the first and the second voltage level is equal to approximately the threshold voltage.

17. The method of claim 15 wherein the memory cell is a thinly capacitively coupled thyristor memory cell.

18. The method of claim 17 wherein the thinly capacitively coupled thyristor memory cell has an anode, and wherein the pulsing comprises pulsing the second word line to a voltage level that is substantially the same as a voltage at the anode.

19. The method of claim 17 wherein the pulsing the second word line comprises pulsing the second word line to a third positive level, and wherein the third voltage level is higher than the first voltage level.

20. The method of claim 17 wherein the pulsing the second word line comprises pulsing the second word line to a third positive level, and wherein the third voltage level is higher than the second voltage level.

21. The method of claim 15 wherein the memory cell is one of an array of memory cells.

22. The method of claim 15 wherein the pulsing comprises pulsing the second word line to a voltage level that is higher than the second voltage level.

23. The method of claim 15 wherein the pulsing comprises pulsing the second word line to a voltage level that is higher than the first voltage level.

24. The method of claim 15 wherein the second word line has a negative steady-state voltage.

* * * * *